United States Patent [19]

Paz-Pujalt et al.

[11] Patent Number: 5,492,776
[45] Date of Patent: Feb. 20, 1996

[54] HIGHLY ORIENTED METAL FLUORIDE THIN FILM WAVEGUIDE ARTICLES ON A SUBSTRATE

[75] Inventors: Gustavo R. Paz-Pujalt, Rochester; Liang-Sun Hung, Webster; James M. Chwalek, Rochester; Anna L. Hrycin, Rochester; Dilip K. Chatterjee, Rochester; Duncan A. Richards, Rochester, all of N.Y.

[73] Assignee: Eastman Kodak Company, Rochester, N.Y.

[21] Appl. No.: 186,415

[22] Filed: Jan. 25, 1994

[51] Int. Cl.⁶ .................................................. B32B 5/16
[52] U.S. Cl. .................. 428/696; 428/691; 428/697; 428/699; 428/913; 250/484.4; 250/486.1; 385/130; 385/131; 385/132; 385/142; 385/144; 359/332
[58] Field of Search .................................. 428/690, 691, 428/696, 697, 699, 913; 423/464, 472; 252/301.36, 301.4 H, 301.4 F; 250/483.1, 484.4, 486.1, 581; 385/129, 130, 131, 132, 141, 142, 144; 359/326, 332, 328

[56] References Cited

U.S. PATENT DOCUMENTS

| 4,741,893 | 5/1988 | Watanabe | 423/464 |
| 4,770,950 | 9/1988 | Ohnishi | 428/691 |
| 4,777,099 | 10/1988 | Mimura | 428/691 |
| 5,051,278 | 9/1991 | Paz-Pujalt | 427/108 |

FOREIGN PATENT DOCUMENTS

| 533236 | 3/1993 | European Pat. Off. . |
| 5230452 | 9/1993 | Japan . |

OTHER PUBLICATIONS

F. Auzel, D. Pecile, Journal of Luminescence, 8, 32–43, 1973.

Primary Examiner—Archene Turner
Assistant Examiner—Timothy M. Speer
Attorney, Agent, or Firm—Raymond L. Owens

[57] ABSTRACT

A highly oriented thin film of specific barium fluoride materials deposited at low temperatures are useful as Upconversion waveguides.

4 Claims, 1 Drawing Sheet

HIGHLY ORIENTED METAL FLUORIDE THIN FILM WAVEGUIDE ARTICLES ON A SUBSTRATE

CROSS REFERENCE TO RELATED APPLICATIONS

Reference is made to commonly assigned U.S. Pat. No. 5,436,919 entitled Multiwavelength Upconversion Waveguide Laser by James M. Chwalek et al, filed concurrently herewith, and commonly assigned U.S. patent application 08/186,400 filed Jan. 25, 1994, entitled A Device for Converting Invisible and Visible Radiation to Visible Light and/or UV Radiation by Gustavo R. Paz-Pujalt et al, filed concurrently herewith, the disclosures of which are incorporated herein.

FIELD OF THE INVENTION

The present invention relates to devices for convening relatively long wavelengths into a plurality of components, each having a desired wavelength.

BACKGROUND OF THE INVENTION

Metal fluoride phosphors have been known for some time (F. Auzel, D. Pecile, Journal of Luminescence, 8, 32–43, 1973). These phosphors may be used for Upcoversion of infrared (IR) radiation to various forms of visible light. It was not until the development and commercialization of compound semiconductor diode lasers, that emit laser radiation at IR frequencies, that interest in these phosphors reappeared. More specifically there is a great deal of interest in thin film articles, based on these phosphors, that can be optically coupled to said laser diodes to produce visible light. ZBLAN (Zr, Ba, La, Al, Nd), AZF (Al, Zr, Y, etc), and AYF (AL, Y, Mg, etc.), collectively known as heavy metal fluoride glass phosphors, are some of the phosphors that have been identified as effective Upconversion phosphors. These types of material are difficult to deposit in thin film form because of the large variance in the vapor pressures, and different chemical stability of the constituent fluorides. When depositing mixed alkaline-earth metal fluorides and rare earth metal fluorides, this can result in polycrystalline films with the possible contamination of carbon and oxygen furthermore their processing required high temperatures usually above 500° C. (G. R. Paz-Pujalt, U.S. Pat. No. 5,051,278, issued June 23, 1992 entitled Method of Forming Metal Fluoride Films by the Decomposition of Metalloorganic Compounds in the Presence of a Fluorinating Agent).

SUMMARY OF THE INVENTION

It is an object of the present invention to provide low loss highly oriented crystalline phosphor thin films of Upconversion phosphors and method of making same.

Another object is to provide a way of integrating an active light emitting material LASER to a phosphor waveguide to produce UV and visible light based on Upconversion.

In accordance with the invention, an article which can be used as an Upconversion waveguide comprising:

a substrate and a thin highly oriented crystalline film includes an alkaline earth and a mixture of rare-earth fluorides on the substrate selected so that the article is capable of converting IR radiation and visible light into visible RGB-UV radiation and which have the formula

  I.

or

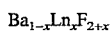  II.

wherein

Ln is Y, Yb, Ho, Er, Tm or Pr or a combination thereof and x has a range up to 0.27. It is noted that there are other compositions like $Ba_{4\pm x}(Y,Ln)_{3\pm x}F_{17\pm x}$ where x can range up to 0.25.

Advantages

Advantages of this invention are that it provides: highly oriented thin films at low deposition temperatures (<240° C.) permit the utilization of a broad range of substrates; low processing temperature eliminates thin film-substrate interactions and permits deposition onto semiconductor material substrates; and these materials do not suffer photorefractive damage. A feature is that planar waveguides made in accordance with this invention can be readily patterned into channel waveguides. Another feature of this invention is that visible light produced by the waveguide can be used to print or record on photographic media.

Detailed Description of the Invention

Figure 1:
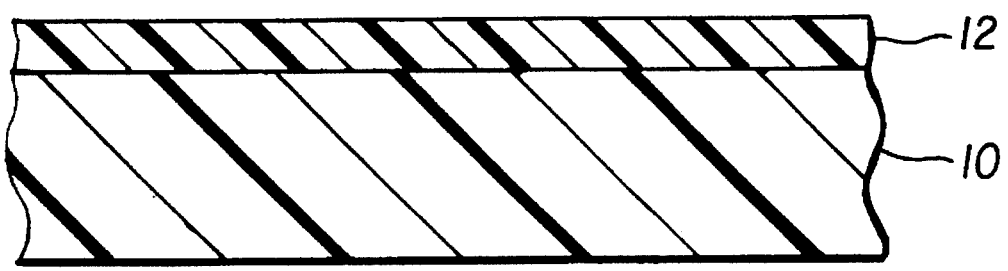
FIG. 1 shows a side view of an embodiment of a multiwavelength Upconversion highly oriented thin film phosphor waveguide on a substrate in accordance with this invention.
Figure 2:
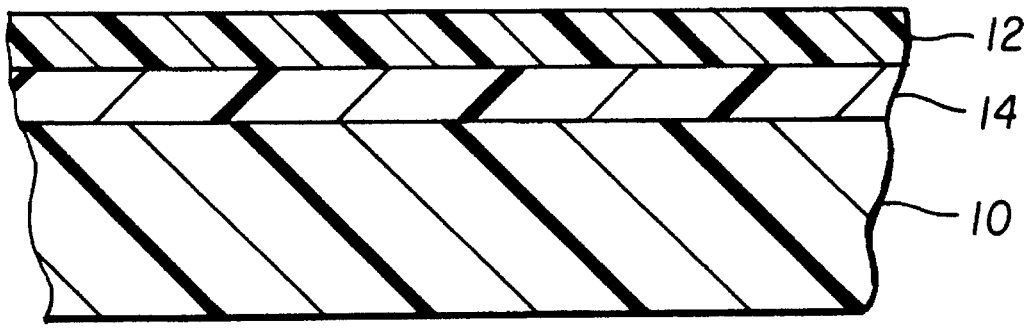
FIG. 2 shows a side view of another multiwavelength Upconversion phosphor waveguide on an interfacial layer on a substrate.

Turning now to FIGS. 1 and 2, where two separate embodiments of this invention are shown. In FIG. 1 a substrate 10 is provided. Upon this substrate 10 is a highly oriented phosphor thin film 12 which has an index of refraction greater than the index of refraction of the substrate 10. By thin film is meant a film which has a thickness of 2 microns or less. We have determined that the thin film 12 should be highly oriented because when it is polycrystalline scattering losses and lattice structure mismatches are of concern. By highly oriented is meant that an a-crystalline direction in the case of I is parallel to the substrate.

In FIG. 2 another embodiment of the invention is shown. There is also provided a substrate 10 and a highly oriented phosphor thin film 12 interposed between the substrate 10 and the highly oriented phosphor thin film 12 is an interfacial buffer layer 14. We have determined that the buffer layer is advantageous because the buffer layer is selected to have a lower index of refraction than the amorphous phosphor thin film 12. The substrate 10 can then be selected from a wider range of materials which have a higher index of refraction such as, for example, gallium arsenide. In fact, gallium arsenide will typically have a higher index of refraction that the amorphous phosphor thin film 12.

The following phosphor compositions provide highly oriented thin films which can be used in accordance with this invention:

  I.

or

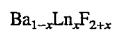  II.

wherein

Ln is Y, Yb, Ho, Er, Tm or Pr or a combination thereof and x has a range of up to 0.27.

The advantages of these family of phosphors over others are that the vapor pressures for the constituent fluorides can be closely matched, making them ideal for thermal deposition and electron-beam (e-beam) deposition. The lattice constant of I can be closely matched to that of $BaF_2$ (100). The lattice constant of II can be matched also to $BaF_2$ single crystal substrates, and to the pseudo lattice-constant of $SiO_2$ (a=5.43 Å). The refractive indices of $BaF_2$ (n=1.473) and $SiO_2$ (n=1.467) fall below the indices of the described phosphor compounds (n~1.54) therefore a thin film of the phosphor material on the described substrates would be a waveguide. The Upconversion phosphor thin film waveguides that when optically coupled to a pump source emitting radiation in the IR region convert this radiation into visible light and UV radiation. The composition of the visible light obtained can be classified into four main groups based on their wavelength 350–370 nm (UV), 440–480 nm (blue), 500–550 nm (green), and 630–680 nm (red) visible light. The efficiency of conversion and the specific wavelength intensities amongst these groups can be varied according to the ratios of the component elements. The channels, altering the composition or other well known methods of channel waveguide fabrication.

Highly oriented thin films of $BaLn_2F_8$ (monoclinic, lattice constant a=6.931–7.023 Å depending on Ln) have been deposited onto $BaF_2$ (100), a=6.2001 Å; Si (100); and fused silica by thermal evaporation from a source consisting of a physical mixture of the constituent metal fluorides at the desired proportions.

The refractive indices of $BaF_2$ (n=1.473), $SiO_2$ (n=1.467) fall below the index of the described phosphors compounds, therefore deposition of a highly oriented phosphor thin films 12 onto any of these substrates would result in the formation of thin film waveguides. The invention provides an effective Upconversion crystalline alkaline earth rare fluoride phosphor thin film waveguide that when optically coupled to a pump source emitting radiation in the IR region or in the range of 645 nm to 665 nm or 675 nm to 685 nm converts this radiation into visible light and ultraviolet radiation. It also provides for a low temperature fabrication process. The spectral distribution of the visible light obtained can be classified into four main groups based on their wavelength: 350–370 nm (UV); 440–480 nm (blue); 500–550 nm (green); and 600–650 nm (red). The efficiency of conversion and the specific wavelength intensities among these groups can be optimized by varying the ratios of the constituting elements, and by processing parameters. The radiation produced can be used for printing or recording onto photographic media. Planar waveguides can be physically or chemically modified, to become channel waveguides, by creating channels, altering the chemical composition or other well known methods of channel waveguide fabrication. When the appropriate coatings or gratings are designed onto the thin film waveguides light amplification by stimulated emission resonance (LASER) activity can be obtained.

Thin highly oriented phosphor thin films 12 are deposited by electron beam evaporation or thermal evaporation from a melt of the corresponding fluorides onto a substrate 10. The resulting film, when appropriately constituted, behaves as a photon addition phosphor converting invisible IR radiation and visible radiation into visible and UV output wavelengths. Preferred composition of the glassy films is Ba-Ln-F where Ln can be =Y, Yb, Dy, Ho, Er, Tm, Lu. Films were deposited by electron beam evaporation and by thermal evaporation under vacuum at a pressure of $5 \times 10^6$ torr. The substrate 10 was maintained at <240° C. In some cases an ion beam was fired at the substrate 10 during film growth (ion assisted deposition (IAD)) in order to improve certain characteristics of the film. The preferred substrates 10 are primarily those that can withstand the deposition temperature and those have the correct index of refraction in order to form waveguides.

The list of substrates includes, but is not limited to, the following:

| | |
|---|---|
| fused silica | (n = 1.457 @ .59 μm) |
| barium fluoride | (n = 1.473 @ .546 μm) |
| magnesium fluoride | (n = 1.378 @ .59 μm) |
| calcium fluoride | (n = 1.424 @ 2.0 μm) |
| strontium fluoride | (n = 1.439 @ .546 μm) |
| lithium fluoride | (n = 1.379 @ 2.0 μm) |

These substrates may be used as single crystals or in their polycrystalline form or as films of the appropriate thickness deposited onto other substrates. Other substrates and highly oriented phosphor thin film 12 combinations include silicon oxide, calcium fluoride, magnesium fluoride, barium fluoride deposited on Si or III-V semiconductors comprised of (III=Al,Ga,In)-(V=N,P,As). Other substrates may be polymeric materials that can withstand the deposition temperature. These materials can be directly coated by the phosphor thin film.

EXAMPLE 1

A mixture of $BaF_2$, $YF_3$, $YbF_3$ and $TmF_3$ powders were weighed and mixed in the molar proportions of 1:1:0.99:0.01. After mechanical mixing the resulting mixture was used for depositing thin films by electron beam evaporation onto Si and onto fused silica substrates. A film thickness of 0.25 μm was obtained when the deposition lasted for 2 hours and the substrate temperature was 240° C. The resulting film was amorphous to x-ray diffraction measurements. After rapid thermal annealing treatment at 1000° C. for 10 seconds, x-ray diffraction revealed preferred orientation along the a-axis. When irradiated by 960 μm IR radiation, the film produced visible light and UV radiation. The produced radiation had the following composition: 350–370 nm (UV); 440–480 nm (blue); 500–550 nm (green); and 630–680 nm (red) visible light.

EXAMPLE 2

A mixture of $BaF_2$, $YF_3$, $YbF_3$, $ErF_3$ and $TmF_3$ powders were weighed and mixed in the molar proportions of 1:1:0.99:0.005:0.005 in the formula $BaLn_2F_8$. After mechanical mixing the resulting mixture was used for depositing thin films by thermal evaporation onto fused silica substrates. A film thickness of 1 μm was obtained when the deposition lasted for 2 hours and the substrate temperature was 240° C. The resulting film was amorphous to x-ray diffraction measurements. After rapid thermal annealing treatment at 900° C. for 20 seconds, x-ray diffraction revealed preferred orientation along the a-axis in the fused quartz substrate. When irradiated by 960 μm IR radiation, the film produced visible light. The produced radiation had the following composition: 350–370 nm (UV); 440–480 nm (blue); 500–550 nm (green); and 630–680 nm (red) visible light.

EXAMPLE 3

A mixture of $BaF_2$, $YF_3$, $YbF_3$ and $TmF_3$ powders were weighed and mixed in the molar proportions of 1:1:0.99:0.005. After mechanical mixing the resulting mixture was used for depositing thin films by thermal evaporation onto a $BaF_2$ wafer oriented in the (100) direction. A film thickness of 1 μm was obtained when the deposition lasted for 2 hours and the substrate temperature was 240° C. The resulting film was amorphous to x-ray diffraction measurements. After rapid thermal annealing treatment at 900° C. for 20 seconds, x-ray diffraction revealed preferred orientation along the a-axis. When irradiated by 960 μm IR radiation, the film produced visible light. The produced radiation had the following composition: 350–370 nm (UV); 440–480 nm (blue); 500–550 nm (green); and 630–680 nm (red) visible light.

EXAMPLE 4

A mixture of $BaF_2$, $YF_3$, $YbF_3$ and $TmF_3$ powders were weighed and mixed in the molar proportions of 1:1:0.99:0.01. After mechanical mixing the resulting mixture was used for depositing thin films by thermal evaporation onto a fused silica substrate. A film thickness of 1.4 μm was obtained. The deposition was carried out with ion assisted deposition at 300 eV. The resulting film was highly oriented in the a-crystallographic direction based on x-ray diffraction measurements. When irradiated by 647 μm IR radiation, the film produced UV and visible radiation. The produced radiation had the following composition: 350–370 nm (UV); 440–480 nm (blue); 500–550 nm (green); and 630–680 nm (red) visible light

EXAMPLE 5

A mixture of $BaF_2$, $YF_3$, $YbF_3$, $ErF_3$ and $TmF_3$ powders were weighed and mixed in the molar proportions of 0.77–0.10–0.10–0.03. After mechanical mixing the resulting mixture was used for depositing thin films by thermal evaporation onto a $BaF_2$ wafer oriented in the (100) direction. A film thickness of 2 μm was obtained when the deposition lasted for approximately 3 hours and the substrate temperature was 240° C. The resulting film was amorphous to x-ray diffraction measurements. After rapid thermal annealing treatment at 900° C. for 20 seconds, x-ray diffraction revealed a preferred orientation along the a-axis. When irradiated by 960 μm IR radiation, the film produced visible light. The produced radiation had the following composition: 350–370 nm (UV); 440–480 nm (blue); 500–550 nm (green); and 630–680 nm (red) visible light.

EXAMPLE 6

A mixture of $BaF_2$, $YF_3$, $YbF_3$ and $TmF_3$ powders were weighed and mixed in the molar proportions of 0.77–0.10–0, 1014 0.03. After mechanical mixing the resulting mixture was used for depositing thin films by thermal evaporation onto a Si wafer oriented in the (100) direction coated with a layer of $SiO_2$. A thin fill thickness of 2 μm was obtained when the deposition lasted for approximately 3 hours and the substrate temperature was 240° C. The resulting film was amorphous to x-ray diffraction measurements. After rapid thermal annealing treatment at 900° C. for 20 seconds, x-ray diffraction revealed a preferred orientation along the a-axis. When irradiated by 960 μm IR radiation, the film produced visible light The produced radiation had the following composition: 350–370 nm (UV); 440–480 nm (blue); 500–550 nm (green); and 630–680 nm (red) visible light.

The invention has been described in detail with particular reference to certain preferred embodiments thereof, but it will be understood that variations and modifications can be effected within the spirit and scope of the invention.

| PARTS LIST | |
|---|---|
| 10 | substrate |
| 12 | film |
| 14 | buffer layer |
| 16 | step |

We claim:

1. An article which can be used as an Upconversion waveguide comprising:

a substrate and a thin highly oriented crystalline film comprising an alkaline earth fluoride and at least one mixture of rare earth fluorides on the substrate selected so that the article is capable of converting IR radiation and visible light into visible RGB-UV radiation and which have the formula $$BaLn_2F_8 \qquad \text{I.}$$

or $$Ba_{1-x}Ln_xF_{2+x} \qquad \text{II.}$$

wherein

Ln is a combination of at least two selected from the group consisting of Y, Yb, Ho, Er, Tm and Pr and x is in a sufficient amount up to 0.27 to cause Upconversion.

2. An article as in claim 1 wherein the substrate is selected to have a lower refractive index than the thin film and the substrate is selected from the group consisting of silicon coated with silicon oxide, and a polymeric material coated with at least one selected from the group consisting of lithium fluoride, magnesium fluoride, calcium fluoride, strontium fluoride, barium fluoride, and silicon oxide.

3. The article as set forth in claim 1 wherein an interfacial buffer layer is disposed between the substrate and the thin film the buffer layer being selected from the group consisting of lithium fluoride, magnesium fluoride, calcium fluoride, strontium fluoride, barium fluoride, and silicon oxide.

4. The article as set forth in claim 1 wherein the substrate is a polymeric material coated directly by the thin film.

* * * * *